United States Patent [19]

Hoekstra et al.

[11] Patent Number: 4,899,317

[45] Date of Patent: Feb. 6, 1990

[54] BIT LINE PRECHARGE IN A BIMOS RAM

[75] Inventors: George P. Hoekstra, Fair Oaks, Calif.; Lal C. Sood; Samuel E. Alexander, both of Austin, Tex.

[73] Assignee: Motorola, Inc., Schaumburg, Ill.

[21] Appl. No.: 151,044

[22] Filed: Feb. 1, 1988

[51] Int. Cl.[4] .............................................. G11C 11/40
[52] U.S. Cl. ..................................... 365/203; 365/177; 365/190; 365/208
[58] Field of Search ............... 365/203, 177, 205, 207, 365/208, 190, 189, 230, 233, 189.06, 189.09, 230.01

[56] References Cited

U.S. PATENT DOCUMENTS

| | | | |
|---|---|---|---|
| 4,110,840 | 8/1978 | Abe et al. | 365/203 |
| 4,386,419 | 5/1983 | Yamamoto | 365/203 |
| 4,604,533 | 8/1986 | Miyamoto et al. | 365/190 |
| 4,665,505 | 5/1987 | Miyakawa et al. | 365/190 |
| 4,682,200 | 6/1987 | Uchida et al. | 365/190 |
| 4,727,517 | 2/1988 | Ueno et al. | 365/203 |

FOREIGN PATENT DOCUMENTS

| | | | |
|---|---|---|---|
| 0116986 | 7/1984 | Japan | 365/203 |
| 0163295 | 8/1985 | Japan | 365/203 |

Primary Examiner—Glenn A. Gossage
Attorney, Agent, or Firm—James L. Clingan, Jr.

[57] ABSTRACT

In a static random access memory in which the array is comprised of MOS transistors and at least some of the peripheral circuits are comprised of bipolar transistors, the bit lines and data lines are precharged to a base to emitter voltage drop (i.e. one Vbe) below the positive power supply voltage. This increases cell stability. Additionally, Vbe varies comparatively little over process. Additionally, precharging the bit lines and data lines to a Vbe below the positive power supply voltage allows for the use of a high speed bipolar differential amplifier in its optimum operating range as the first stage sense amplifier.

12 Claims, 3 Drawing Sheets

BIT LINE PRECHARGE IN A BIMOS RAM

FIELD OF THE INVENTION

The present invention relates to BIMOS random access memories (RAMs), and more particularly, to BIMOS RAMs which have bit lines precharged before performing a read.

BACKGROUND OF THE INVENTION

At a BIMOS static random access memory (SRAM) is typically characterized by an array of memory cells comprised of MOS transistors and peripheral circuits which include bipolar transistors. In general the bipolar transistors are used for their higher speed characteristics and the MOS transistors are used for their lower power characteristics to obtain both high speed and low power. In SRAMs the bit lines are generally precharged prior to performing a read. One technique, described in U.S. Pat. No. 4,110,840, Abe et al, teaches precharging the bit lines and data lines in response to a complemented write enable signal, i.e., performing a precharge upon the termination of the write mode. The precharge taught is to a voltage level of one N channel threshold voltage below the positive power supply voltage. This is a generally desirable level because it is near the optimum gain of the typical MOS or bipolar sense amplifier and yet is high enough for fairly good cell stability. The cell is more stable and also faster in establishing a given voltage differential on the bit line pair when the bit line voltage is higher. Too high of a voltage is not desirable because the gain of the sense amplifier is reduced. Thus, one N channel threshold voltage below the positive power supply has often been chosen for the precharge voltage. There are some problems with using the threshold voltage of an N channel transistor to reference the bit line voltage. One problem is threshold voltage variation over processing. There is also substantial body effect in using an N channel transistor for precharging the bit lines which substantially increases the drop below the positive power supply voltage provided to the bit lines. This body effect also varies with process variations and power supply voltage. These variations in threshold voltage are not compensated for by either a typical bipolar or a typical MOS sense amplifier.

SUMMARY OF THE INVENTION

An object of the invention is to provide an improved BIMOS SRAM.

Another object of the invention is to provide a BIMOS SRAM with improved bit line precharge.

Yet another object of invention is to provide an improved bit line precharge for a high speed SRAM.

These and other objects are achieved in a A memory having a read mode and a write mode and having a first power supply terminal for receiving a positive power supply voltage. The memory has an array of MOS memory cells, a pair of data lines, a column decoder, a row deocoder, and a bit line precharge circuit. The array of MOS memory cells is coupled to bit line pairs and word lines at intersections thereof. The column decoder means is coupled to the bit line pairs and couples a selected bit line pair to the pair of data lines as determined by a column address. The row decoder is coupled to the word lines and enables a selected word line as determined by a row address. The bit line precharge circuit is coupled to the bit line pairs and charges the bit line pairs to one Vbe below the voltage at the first power supply terminal in response to the memory switching from the write mode to the read mode.

DESCRIPTION OF THE INVENTION

Figure 1:
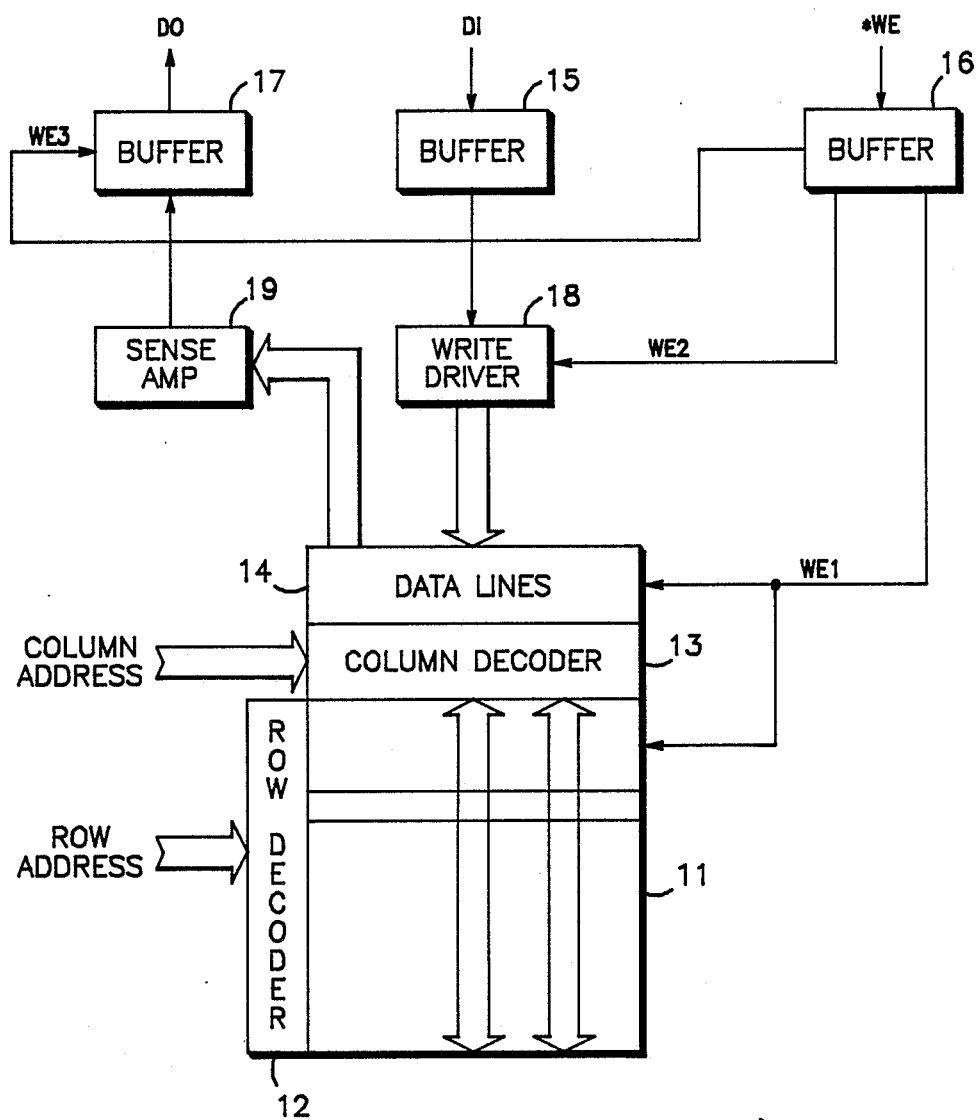
FIG. 1 is diagram of a memory which can use the invention.

Shown in FIG. 1 is a memory 10 comprised of an array 11, a row decoder 12, a column decoder 13, data lines 14, a data-in buffer 15, a write enable buffer 16, a data-out buffer 17, a write driver 18, and a sense amplifier 19. Buffer 16 receives an externally provided write enable signal *WE which is active at a logic low and thus indicates that memory 10 is to be in a write mode when it is a logic low. The asterisk (*) in front of the signal designation indicates that the signal is active at a logic low. Signal *WE at a logic high indicates that memory 10 is in a read mode. Buffer 16 outputs a first write enable signal WE1, a second write enable signal WE2, and a third write enable signal WE3 responsive to signal *WE. Signal WE1 is used by data lines 14 and array 11. Signals WE2 and WE3 are used by write driver 18 and buffer 17, respectively.

In general the operation of memory 10 is described in two modes, the read mode and the write mode. In the read mode, signal *WE is a logic high, and buffer 17 outputs a data-out signal DO representative of a logic state stored in a memory cell selected by a column address and a row address. Row decoder 12 selects a word line in array 11 as determined by the row address. All of the memory cells coupled to the selected word line are enabled. The memory cells in array 11 are coupled to word lines and bit line pairs at intersections thereof. When enabled, a memory cell either outputs data onto the bit line pair to which it is coupled or receives data from the bit line pair to which it is coupled. In the read mode, a selected memory cell outputs data onto the bit line pair to which it is coupled. Column decoder selects a bit line pair in response to a column address. Column decoder 13 accomplishes the selection by coupling the selected bit line pair to data lines 14. Sense amplifier 19 senses the logic state provided onto data lines 14 and outputs it to buffer 17 which in turn outputs signal DO in response to the logic state provided by sense amplifier 19.

In the write mode, the selection of a cell is accomplished in the same manner as in the read mode. In the write mode a selected bit line pair is driven to a logic state by virtue of data lines 14 being driven to a logic state by write driver 18. Write driver 18 drives data lines 14 to a logic state representative of the logic state of a data-in signal DI received by buffer 15. Buffer 15 provides an output to write driver 18 representative of the logic state of signal DI. The selected bit line pair is coupled to data lines 14 so the selected bit line pair is driven to the logic state representative of the logic state of signal DI.

Figure 2:
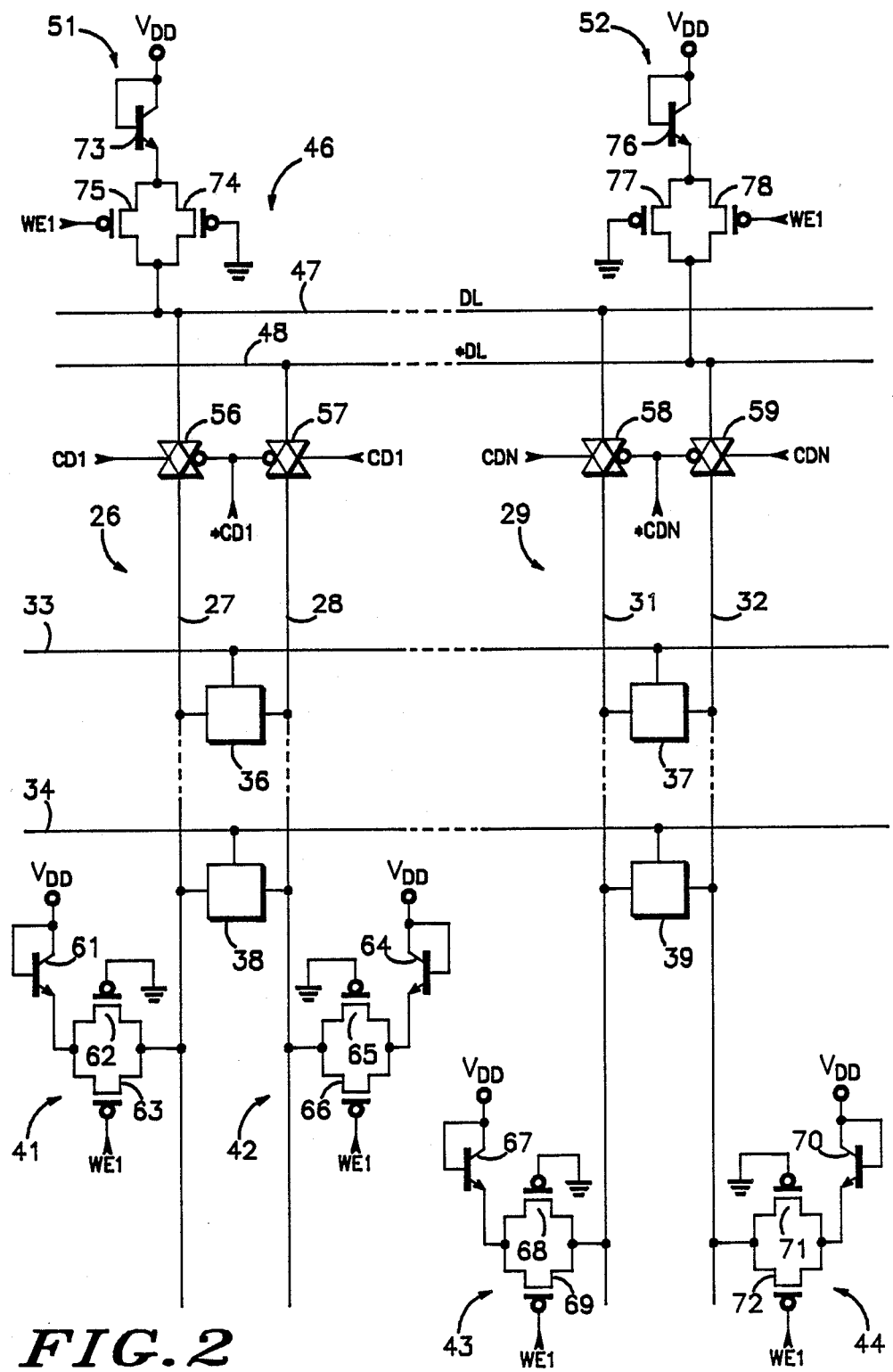
FIG. 2 is a circuit diagram of a first portion of the memory of FIG. 1 according to a preferred embodiment of the invention.

Shown in FIG. 2 is a portion of array 11, column decoder 13, and data lines 14. The portion of array 11 shown in FIG. 2 comprises a bit line pair 26 comprised of a bit line 27 and a bit line 28, a bit line pair 29 comprised of a bit line 31 and a bit line 32, a word line 33, a word line 34, a memory cell 36 coupled to word line 33 and bit lines 27 and 28, a memory cell 37 coupled to word line 33 and bit lines 31 and 32, a memory cell 38 coupled to word line 34 and bit lines 27 and 28, a memory cell 39 coupled to word line 34 and bit lines 31 and 32, a bit line precharge circuit 41 connected between a positive power supply terminal VDD and bit line 27, a bit line precharge circuit 42 connected between VDD and bit line 28, a bit line precharge circuit 43 connected between VDD and bit line 31, and a bit line precharge circuit 44 connected between VDD and bit line 32. Data lines 14 comprises a data line pair 46 comprise of a data line 47 and a data line 48, a data line precharge circuit 51 connected between VDD and data line 47, and a data line precharge circuit 52 connected between VDD and data line 48. The portion of column decoder shown in FIG. 2 comprises CMOS transmission gates 56, 57, 58, and 59. Transmission gate 56 has a first signal terminal connected to data line 47, a second signal terminal connected to bit line 27, a true control terminal for receiving a true column decoder signal CD1, and a complementary control input for receiving a complementary column decoder signal *CD1. Transmission gate 57 has a first signal terminal connected to data line 48, a second signal terminal connected to bit line 28, a true control terminal for receiving a true column decoder signal CD1, and a complementary control input for receiving a complementary column decoder signal *CD1. Transmission gate 58 has a first signal terminal connected to data line 47, a second signal terminal connected to bit line 31, a true control terminal for receiving a true column decoder signal CDN, and a complementary control input for receiving a complementary column decoder signal *CDN. Transmission gate 59 has a first signal terminal connected to data line 48, a second signal terminal connected to bit line 32, a true control terminal for receiving a true column decoder signal CDN, and a complementary control input for receiving a complementary column decoder signal *CDN.

Bit line precharge circuit 41 comprises an NPN transistor 61, a P channel transistor 62, and a P channel transistor 63. Transistor 61 has a base and collector connected to VDD and an emitter. Transistor 62 has a source connected to the emitter of transistor 61, a gate connected to ground, and a drain connected to bit line 27. Transistor 63 has a source connected to the emitter of transistor 61, a gate for receiving write enable signal WE1, and a drain connected to bit line 27. Bit line precharge circuit 42 comprises an NPN transistor 64, a P channel transistor 65, and a P channel transistor 66. Transistor 64 has a base and collector connected to VDD and an emitter. Transistor 65 has a source connected to the emitter of transistor 64, a gate connected to ground, and a drain connected to bit line 28. Transistor 66 has a source connected to the emitter of transistor 64, a gate for receiving write enable signal WE1, and a drain connected to bit line 28. Bit line precharge circuit 43 comprises an NPN transistor 67, a P channel transistor 68, and a P channel transistor 69. Transistor 67 has a base and collector connected to VDD and an emitter. Transistor 68 has a source connected to the emitter of transistor 67, a gate connected to ground, and a drain connected to bit line 31. Transistor 69 has a source connected to the emitter of transistor 67, a gate for receiving write enable signal WE1, and a drain connected to bit line 31. Bit line precharge circuit 44 comprises an NPN transistor 70, a P channel transistor 71, and a P channel transistor 72. Transistor 70 has a base and collector connected to VDD and an emitter. Transistor 71 has a source connected to the emitter of transistor 70, a gate connected to ground, and a drain connected to bit line 32. Transistor 72 has a source connected to the emitter of transistor 70, a gate for receiving write enable signal WE1, and a drain connected to bit line 32. Data line precharge circuit 51 comprises an NPN transistor 73, a P channel transistor 74, and a P channel transistor 75. Transistor 73 has a base and collector connected to VDD and an emitter. Transistor 74 has a source connected to the emitter of transistor 73, a gate connected to ground, and a drain connected to data line 47. Transistor 75 has a source connected to the emitter of transistor 73, a gate for receiving write enable signal WE1, and a drain connected to data line 47. Data line precharge circuit 52 comprises an NPN transistor 76, a P channel transistor 77, and a P channel transistor 78. Transistor 76 has a base and collector connected to VDD and an emitter. Transistor 77 has a source connected to the emitter of transistor 76, a gate connected to ground, and a drain connected to data line 48. Transistor 78 has a source connected to the emitter of transistor 76, a gate for receiving write enable signal WE1, and a drain connected to data line 48.

Each of bit line precharge circuits 41–44 and data line precharge circuits operate in the same way to precharge bit lines 27, 28, 31, and 32 and data lines 47 and 48, respectively. Using bit line precharge circuit 41 as an example, transistor 61 causes a base-emitter voltage drop between VDD and the sources of transistors 62 and 63. This is commonly referred to as a Vbe drop which is about 0.7 volt. There is very little variation in a Vbe drop over process variations compared to the variation in N channel threshold voltage over comparable process variations. Transistor 63 is enabled when signal WE switches from a logic high to a logic low which occurs when memory 10 switches from the write mode to the read mode. Bit line 27 will then be precharged to one Vbe below VDD in response to memory 10 switching from the write mode to the read mode. Transistor 63 is of relatively high gain so that bit line 27 is quickly precharged to this desired level. During the write mode when signal WE1 is a logic high, transistor 63 will be non-conductive. Transistor 62 remains conductive so that there is still a conductive path between transistor 61 and bit line 27. This conductive path provided by transistor is of relatively high resistance so that if bit line 27 is driven to a logic low near ground, there will be very little current flowing to bit line 27 via transistors 61 and 62. If bit line 27 is to remain at a logic high, the conductive path provided by transistor 62 will provide enough current to offset any leakage from bit line 27 which would tend to drop the voltage on bit line 27. For any access, either read or write, one bit line of each bit line pair will be at a logic high. In the case of a read the other bit line of the bit line pair will be pulled down sufficiently to establish a detectable voltage differential between the two bit lines which comprise the particular bit line pair. In the case of a write, there will be a selected bit line pair in which one of the bit lines of the selected bit line pair will be pulled sufficiently low in voltage to ensure that the selected cell is written.

Data lines 47 and 48 are precharged in the same manner as the bit lines. Transistors 75 and 78 are responsive to signal WE1 so that there is rapid precharge of the data lines in response to a write to read transition. Transistors 74 and 77 are of relatively low gain and act as keepers for the logic high data lines. Keeping both data lines 47 and 48 precharged is useful for a standby situation in which no bit line pair is coupled to data lines 47 and 48.

Using a Vbe drop below VDD as the precharge voltage on the bit lines increases cell stability while retaining the advantage of having the precharge voltage be at or near the maximum gain bias of a typical bipolar sense amplifier. Most commonly, the bit lines are precharged to an N channel threshold voltage below VDD. This is a larger drop below VDD than a Vbe below VDD so that cell stability is not as great, and the cell is slower in developing a given voltage differential between bit lines of a bit line pair.

Figure 3:
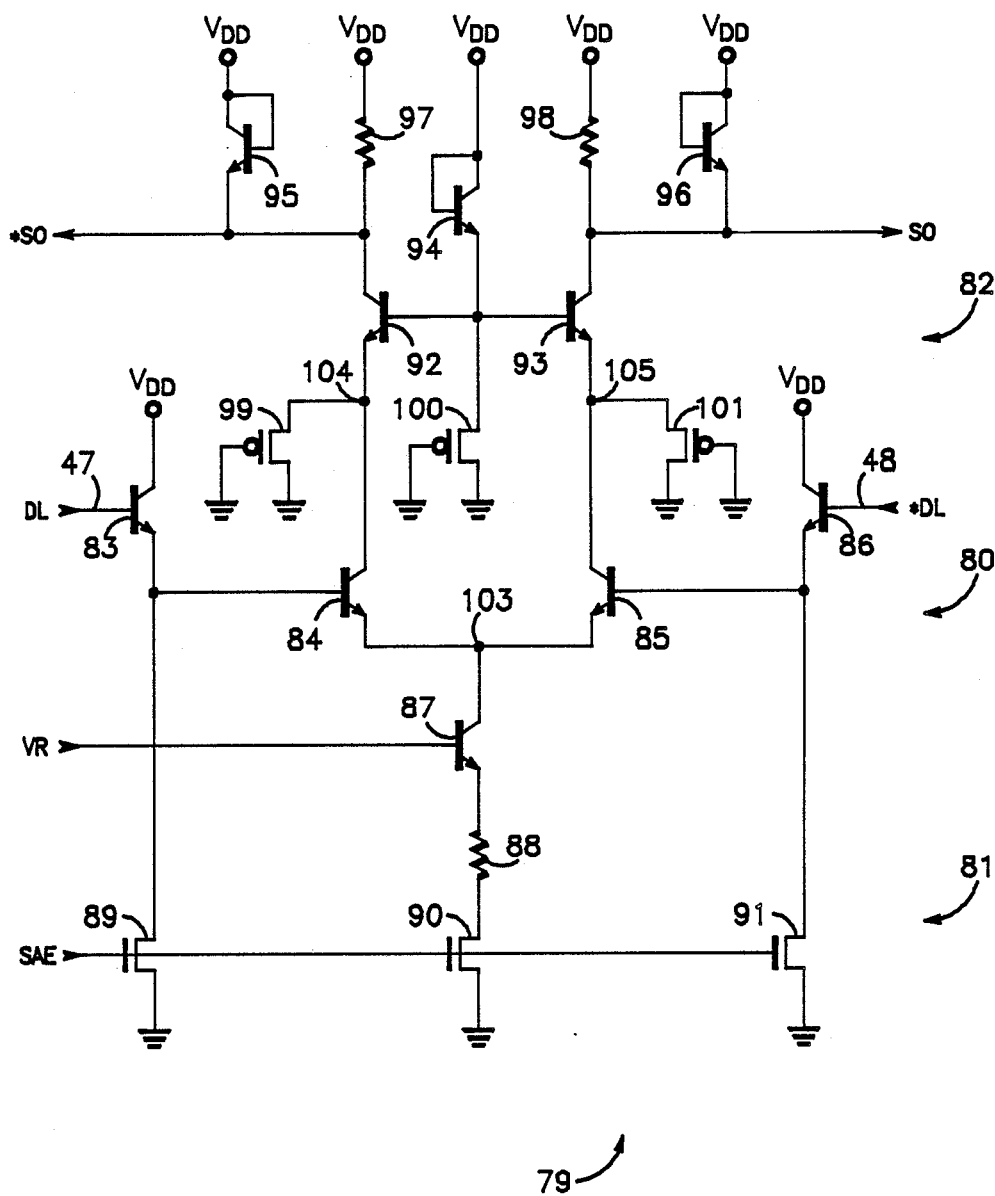
FIG. 3 is a circuit diagram of a second portion of the memory of FIG. 1 which is coupled to the first portion of the memory.

Shown in FIG. 3 is a first stage sense amplifier 79 of sense amplifier 19 which has its high gain at or near one Vbe below VDD comprised generally of a differential portion 80, a current source portion 81, and a load portion 82. Differential portion 80 comprises NPN transistors 83, 84, 85, and 86. Current source portion 81 comprises NPN transistor 87, resistor 88, and N channel transistors 89, 90, and 91. Load portion 82 comprises NPN transistors 92, 93, 94, 95, and 96, resistors 97 and 98, and P channel transistors 99, 100, and 101. Transistor 83 has a base connected to data line 47, a collector connected to VDD, and an emitter. Transistor 84 has a base connected to the emitter of transistor 83, an emitter connected to node 103, and a collector connected to a node 104. Transistor 86 has a base connected to data line 48, a collector connected to VDD, and an emitter. Transistor 85 has a base connected to the emitter of transistor 86, an emitter connected to node 103, and a collector connected to a node 105.

Transistor 87 has a collector connected to node 103, a base for receiving a reference voltage VR, and an emitter. Resistor 88 has a first terminal connected to the emitter of transistor 87, and a second terminal. Transistor 90 has a drain connected to the second terminal of resistor 88, a gate for receiving a sense amplifier enable signal SAE, and a source connected to ground. Transistor 89 has a drain connected to the emitter of transistor 83, a gate for receiving signal SAE, and a source connected to ground. Transistor 91 has a drain connected to the emitter of transistor 86, a gate for receiving signal SAE, and a source connected to ground.

Transistor 92 has an emitter connected to node 104, a collector for providing a complementary sense amplifier output signal *SO, and a base. Transistor 93 has an emitter connected to node 105, a collector for providing a true sense amplifier output signal SO, and a base connected to the base of transistor 92. Transistor 94 has a base and collector connected to VDD, and an emitter connected to the bases of transistors 92 and 93. Transistor 95 has a base and collector connected to VDD, and an emitter connected to the collector of transistor 92. Transistor 96 has a base and collector connected to VDD, and an emitter connected to the collector of transistor 93. Resistor 97 has a first terminal connected to VDD, and a second terminal connected to the collector of transistor 92. Resistor 98 has a first terminal connected to VDD, and a second terminal connected to the collector of transistor 93. Transistor 99 has a source connected to node 104, and a drain and gate connected to ground. Transistor 100 has a source connected to the bases of transistors 92 and 93, and a drain and gate connected to ground. Transistor 101 has a source connected to node 105, and a drain and gate connected to ground.

First stage sense amplifier 79 is enabled when signal SAE is a logic high which causes transistors 89-91 to be conductive. A current path is then provided between node 103 and ground via transistor 87, resistor 88, and transistor 90. Transistors 87 and 90 and resistor 88 provide the current source which is required as part of a differential amplifier. Transistors 89 and 91 provide a current path to ground which causes the emitter to base connection between transistors 83 and 84 and between transistors 86 and 85 to have a faster response to decreases in voltage on data lines 47 and 48, respectively. Transistors 83 and 84 form a high gain pair similar to a Darlington pair for the input from data line 47. Transistors 86 and 85 form a similar pair for data line 48.

Load portion 82 functions to provide additional gain and effectively converts a current differential developed through transistors 84 and 85 to a voltage differential between signals SO and *SO. Load 82 has two inputs connected at nodes 104 and 105 and two outputs for providing signals SO and *SO. P channel transistors 99-101 are useful in maintaining bias control. NPN transistors 94-96 are useful in setting a bias point and limiting low voltage excursion. Resistors 97 and 98 are useful as loads in providing signals SO and *SO.

Transistors 83 and 86 provide a Vbe drop between data lines 47 and 48 and the bases of transistors 84 and 85, respectively. Transistors 84 and 85 provide an additional Vbe drop so that node 103 is biased at three Vbe's below VDD which has been found to be at or near the optimum operating point for amplifier 79. Amplifier 79 is of the type, a differential amplifier with bipolar input transistors, known to be of very high speed. Amplifier 79 is adapted for use with a MOS SRAM which has the bit lines and data lines biased to a Vbe below VDD and VDD is nominally 5 volts. Thus, the biasing of the bit lines and data lines at one Vbe below VDD provides for operation in the high gain region of the bipolar differential amplifier type of sense amplifier while improving cell stability.

Thus, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

We claim:

1. A memory having a read mode and a write mode and having a first power supply terminal for receiving a positive power supply voltage, comprising:

an array of MOS memory cells respectively coupled to bit line pairs and word lines at intersections thereof, each said MOS memory cell characterized as providing a voltage differential on the bit line pair to which it is coupled when the word line to which it is coupled is enabled when the memory is in the read mode;

a pair of data lines;

column decoder means, coupled to the bit line pairs, for coupling a selected bit line pair to the pair of data lines as determined by a column address;

row decoder means, coupled to the word lines, for enabling a selected word line as determined by a row address;

bit line precharge means, coupled to the bit line pairs, for charging the bit line pairs to one Vbe below the voltage at the first power supply terminal in response to the memory switching from the write mode to the read mode;

sense amplifier means comprised of bipolar transistors and coupled to the data lines for amplifying a voltage differential present on the pair of data lines when the memory is in the read mode; and wherein the bit line precharge means comprises:

a plurality of bipolar transistors, each bipolar transistor corresponding to an associated bit line and having a base and collector coupled to the first power supply terminal, and an emitter; and a plurality of coupling means, each coupling means comprising a MOS transistor having a first current electrode coupled to the emitter of an associated bipolar transistor, a second current electrode coupled to the bit line to which the associated bipolar transistor corresponds, and a control electrode for receiving a write enable signal which is responsive to the memory switching from the write mode to the read mode.

2. The memory of claim 1 further comprising data line precharge means, coupled to the pair of data lines, for precharging the pair of data lines to one Vbe below the voltage at the first power supply terminal in response to the memory switching from the write mode to the read mode.

3. The memory of claim 1 further comprising data line precharge means, coupled to the pair of data lines, for precharging the pair of data lines to one Vbe below the voltage at the first power supply terminal in response to the memory switching from the write mode to the read mode.

4. The memory of claim 1 wherein the sense amplifier means comprises:

a first bipolar transistor having a base coupled to a first data line of the data line pair, a collector coupled to the first power supply terminal, and an emitter;

a second bipolar transistor having a base coupled to a second data line of the pair of data lines, a collector coupled to the first power supply terminal, and an emitter;

a third bipolar transistor having a base coupled to the emitter of the first bipolar transistor, a collector, and an emitter;

a fourth bipolar transistor having a base coupled to the emitter of the second bipolar transistor, an emitter coupled to the emitter of the third bipolar transistor, and a collector;

a current source coupled between the commonly connected emitters of the third and fourth bipolar transistors and a second power supply terminal;

load means, coupled to the collectors of the third and fourth bipolar transistors and to the first power supply terminal, for providing a pair of signals at a voltage differential corresponding to a current differential in the third and fourth bipolar transistors.

5. A memory having a read mode and a write mode and having a first power supply terminal for receiving a positive power supply voltage, comprising:

an array of MOS memory cells respectively coupled to bit line pairs and word lines at intersections thereof, each said MOS memory cell characterized as providing a voltage differential on the bit line pair to which it is coupled when the word line to which it is coupled is enabled when the memory is in the read mode;

a pair of data lines;

column decoder means, coupled to the bit line pairs, for coupling a selected bit line pair to the pair of data lines as determined by a column address;

row decoder means, coupled to the word lines, for enabling a selected word line as determined by a row address;

a plurality of bipolar transistors, each bipolar transistor corresponding to a an associated bit line and having a base and collector coupled to the first power supply terminal, and an emitter; and a plurality of MOS coupling transistors, each of said MOS coupling transistors having a first current electrode coupled to the emitter of a an associated one of the bipolar transistors, a second current electrode coupled to the bit line to which the associated bipolar transistor corresponds, and a control electrode for receiving a write enable signal which is responsive to the memory switching from the write mode to the read mode.

6. The memory of claim 5 further comprising:

sense amplifier means comprised of bipolar transistors and coupled to the data lines for amplifying a voltage differential present on the pair of data lines when the memory is in the read mode.

7. The memory of claim 6 further comprising a plurality of keeper transistors, each keeper transistor corresponding to an associated one of the MOS coupling transistors and coupled between the first and second current electrodes thereof.

8. The memory of claim 7 further comprising data line precharge means, coupled to the pair of data lines, for precharging the pair of data lines to one Vbe below the voltage at the first power supply terminal in response to the memory switching from the write mode to the read mode.

9. A memory having a read mode and a write mode and having a first power supply terminal for receiving a positive power supply voltage, comprising:

an array of MOS memory cells respectively coupled to bit line pairs and word lines at intersections thereof, each said MOS memory cell characterized as providing a voltage differential on the bit line pair to which it is coupled when the word line to which it is coupled is enabled when the memory is in the read mode;

a pair of data lines;

column decoder means, coupled to the bit line pairs, for coupling a selected bit line pair to the pair of data lines as determined by a column address;

row decoder means, coupled to the word lines, for enabling a selected word line as determined by a row address;

a plurality of bipolar precharging transistors, each bipolar precharging transistor corresponding to an associated bit line and having a base and collector coupled to the first power supply terminal, and an emitter; and a plurality of MOS coupling transistors, each of said MOS coupling transistors having a first current electrode coupled to the emitter of an associated one of the bipolar precharging transistors, a second current electrode coupled to the bit line to which the associated bipolar precharging transistor corresponds, and a control electrode for receiving a write enable signal which is responsive to the memory switching from the write mode, the read mode.

a first bipolar amplifying transistor having a base coupled to a first data line of the data line pair, a collector coupled to the first power supply terminal, and an emitter;

a second bipolar amplifying transistor having a base coupled to a second data line of the pair of data lines, a collector coupled to the first power supply terminal, and an emitter;

a third bipolar amplifying transistor having a base coupled to the emitter of the first bipolar amplifying transistor, a collector, and an emitter;

a fourth bipolar amplifying transistor having a base coupled to the emitter of the second bipolar amplifying transistor, an emitter coupled to the emitter of the third bipolar amplifying transistor, and a collector;

a current source coupled between the commonly connected emitters of the third and fourth bipolar amplifying transistors and a second power supply terminal;

load means, coupled to the collectors of the third and fourth bipolar amplifying transistors and to the first power supply terminal, for providing a pair of signals at a voltage differential corresponding to a current differential in the third and fourth amplifying bipolar transistors.

10. The memory of claim 9 further comprising data line precharge means, coupled to the pair of data lines, for precharging the pair of data lines to one Vbe below the voltage at the first power supply terminal in response to the memory switching from the write mode to the read mode.

11. A memory having a first power supply terminal for receiving a positive power supply voltage, comprising:

an array of MOS memory cells respectively coupled to bit line pairs and word lines at intersections thereof, each said MOS memory cell characterized as providing a voltage differential on the bit line pair to which it is coupled;

a pair of data lines;

a column decoder means, coupled to the bit line pairs, for coupling a selected bit line pair to the pair of data lines as determined by a column address;

row decoder means, coupled to the work lines, for enabling a selected word line as determined by a row address;

bit line precharge means, coupled to the bit line pairs, for charging the bit line pairs to one Vbe below the voltage at the first power supply terminal;

sense amplifier means comprised ob bipolar transistors and coupled to the data lines for amplifying a voltage differential present on the pair of data lines when the memory is in the read mode; and wherein the bit line precharge means comprises:

a plurality of bipolar transistors, each bipolar transistor corresponding to an associated bit line and having a base and collector coupled to the first power supply terminal, and an emitter; and a plurality of coupling means, each coupling means comprising a MOS transistor having a first current electrode coupled to the emitter of an associated bipolar transistor, a second current electrode coupled to the bit line to which the associated bipolar transistor corresponds, and a control electrode for receiving a write enable signal which is responsive to the memory switching from the write mode to the read mode.

12. The memory claim 11 wherein the sense amplifier means comprises:

a first bipolar transistor having a base coupled to a first data line of the data line pair, a collector coupled to the first power supply terminal, and an emitter;

a second bipolar transistor having a base coupled to a second data line of the pair of data lines, a collector coupled to the first power supply terminal, and an emitter;

a third bipolar transistor having a base coupled to the emitter of the first bipolar transistor, a collector, and an emitter;

a fourth bipolar transistor having a base coupled to the emitter of the second bipolar transistor, an emitter coupled to the emitter of the third bipolar transistor, and a collector;

a current source coupled between the commonly connected emitters of the third and fourth bipolar transistors and a second power supply terminal;

load means, coupled to the collectors of the third and fourth bipolar transistors and to the first power supply terminal, for providing a pair of signals at a voltage differential corresponding to a current differential in the third and fourth bipolar transistors.

* * * * *

UNITED STATES PATENT AND TRADEMARK OFFICE
CERTIFICATE OF CORRECTION

PATENT NO. : 4,899,317
DATED : February 06, 1990
INVENTOR(S) : George P. Hoekstra, Lal C. Sood and Samuel E. Alexander It is certified that error appears in the above-identified patent and that said Letters Patent is hereby corrected as shown below:

Column 10, line 1, change "work" to --word--

Column 10, line 7, change "ob" to --of--

Signed and Sealed this

Seventeenth Day of March, 1992

Attest:

HARRY F. MANBECK, JR.

*Attesting Officer*  *Commissioner of Patents and Trademarks*